United States Patent
Geis et al.

(10) Patent No.: US 9,866,336 B2
(45) Date of Patent: Jan. 9, 2018

(54) PHASED ARRAY ANTENNA SELF-CALIBRATION

(71) Applicant: Google Inc., Mountain View, CA (US)

(72) Inventors: Arnd Geis, Santa Clara, CA (US); Arnold R. Feldman, San Francisco, CA (US)

(73) Assignee: Google LLC, Mountain View, CA (US)

( * ) Notice: Subject to any disclaimer, the term of this patent is extended or adjusted under 35 U.S.C. 154(b) by 392 days.

(21) Appl. No.: 14/741,870

(22) Filed: Jun. 17, 2015

(65) Prior Publication Data

US 2016/0372828 A1    Dec. 22, 2016

(51) Int. Cl.
| | |
|---|---|
| *H01Q 3/00* | (2006.01) |
| *H04B 17/30* | (2015.01) |
| *H01Q 3/26* | (2006.01) |
| *H01Q 3/34* | (2006.01) |
| *H04B 17/14* | (2015.01) |
| *H03G 1/00* | (2006.01) |
| *H03K 5/1532* | (2006.01) |

(52) U.S. Cl.
CPC ............. *H04B 17/30* (2015.01); *H01Q 3/267* (2013.01); *H01Q 3/34* (2013.01); *H03G 1/0017* (2013.01); *H03K 5/1532* (2013.01); *H04B 17/14* (2015.01)

(58) Field of Classification Search
CPC ............ H01Q 3/00; H01Q 3/267; H01Q 3/34; H03G 1/0017; H03K 5/1532; H04B 17/30; H04B 17/14
USPC ....................................................... 342/365
See application file for complete search history.

(56) References Cited

U.S. PATENT DOCUMENTS

| | | | |
|---|---|---|---|
| 6,252,542 B1 | 6/2001 | Sikina et al. | |
| 6,799,026 B1 * | 9/2004 | Scherzer | H04B 7/0805 455/101 |
| 8,957,808 B2 | 2/2015 | Ookawa | |
| 2005/0012658 A1 | 1/2005 | Eriksson | |
| 2006/0044185 A1 * | 3/2006 | Jin | H04B 17/21 342/368 |

(Continued)

FOREIGN PATENT DOCUMENTS

GB        2346013 A      7/2000

OTHER PUBLICATIONS

International Search Report and Written Opionion for Application No. PCT/US2016/024253 dated Jul. 13, 2016.

*Primary Examiner* — Harry Liu
(74) *Attorney, Agent, or Firm* — Honigman Miller Schwartz and Cohn LLP

(57) ABSTRACT

A phased array antenna system includes an array of antennas having first antenna and second antennas disposed equidistantly from a third antenna. The first antenna is associated with a first gain and a first phase and the second antenna is associated with a second gain and a second phase. The first antenna receives a first reference signal corresponding to a calibration reference signal transmitted by the third antenna, and the second antenna receives a second reference signal corresponding to the calibration reference signal transmitted by the third antenna. The second receiver module is configured to adjust the second gain and the second phase associated with the second antenna to match the first gain and the first phase associated with the first antenna by comparing the first reference signal received by the first antenna with the second reference signal received by the second antenna.

30 Claims, 10 Drawing Sheets

(56) References Cited

U.S. PATENT DOCUMENTS

| | | | |
|---|---|---|---|
| 2010/0188304 A1* | 7/2010 | Clymer | H01Q 1/185 343/753 |
| 2011/0001660 A1 | 1/2011 | Ray et al. | |
| 2011/0006949 A1 | 1/2011 | Webb | |
| 2012/0146841 A1 | 6/2012 | Ookawa | |
| 2017/0090016 A1* | 3/2017 | Ikram | G01S 7/4004 |

* cited by examiner

(54) PHASED ARRAY ANTENNA
SELF-CALIBRATION

TECHNICAL FIELD

This disclosure relates to calibration of phased array antennas.

BACKGROUND

Electronically steered antennas (ESA), also known as phased array antennas, combine multiple individual transmit/receive (T/R) modules and antennas to create a larger effective aperture. The electronically controlled phase and gain relationship between the individual T/R modules controls the radiation pattern and therefore directivity of the synthesized aperture. This control over the radiation pattern can be used for beam steering in air and space-borne communication systems, for target acquisition and tracking or for the synthesis of deep nulls for clutter suppression in radar systems.

SUMMARY

One aspect of the disclosure provides a phased array antenna system that includes an array of antennas having a first antenna and a second antenna disposed equidistantly from a third antenna. The system also includes a first receiver module connected to the first antenna and a second receiver module connected to the second antenna. The first antenna is associated with a first gain and a first phase, and the second antenna is associated with a second gain and a second phase. The system further includes a transmit module in communication with the third antenna and a signal generator in communication with the transmit module. The signal generator generates a calibration reference signal, and the third antenna transmits the calibration reference signal. The first antenna receives a first reference signal corresponding to the calibration reference signal transmitted by the third antenna, and the second antenna receives a second reference signal corresponding to the calibration reference signal transmitted by the third antenna. The second receiver module is configured to adjust the second gain and the second phase associated with the second antenna to match the first gain and the first phase associated with the first antenna by comparing the first reference signal received by the first antenna with the second reference signal received by the second antenna.

Implementations of the disclosure may include one or more of the following optional features. In some implementations, the system further includes a peak detector in communication with the first receiver module and the second receiver module. The peak detector receives a summation of the first reference signal and the second reference signal, the second receiver module configured to adjust the second phase and/or the second gain based on an output of the peak detector. The second receiver module may be configured to adjust the second phase so that the output of the peak detector is maximized. The second receiver module may be further configured to adjust the second gain so that the output of the peak detector is minimized when the first phase is shifted 180 degrees.

In some examples, each receiver module is configured to amplify the corresponding received referenced signal. The system may further include a summer in communication with the first receiver module and the second receiver module, the summer summing the first reference signal and the second reference signal. The system further includes an analog-to-digital converter in communication with the peak detector and configured to output a signal in relation to the output of the peak detector. The signal generator may include a phase locked loop. The first antenna, second antenna and third antenna may be connected to a modem. In some examples, the system includes an integrated circuit integrating thereon the first receiver module, the second receiver module, and the transmit module.

The system may further include a second transmit module connected to the second antenna, the second transmit module associated with a transmit gain and a transmit phase. The second receiver may be calibrated to the second transmit module by connecting the second receiver to the second transmit module and adjusting the second gain and the second phase associated with the second transmit module to match the second gain and the second phase associated with the second receiver module.

Another aspect of the disclosure provides a second phased array antenna system that includes an array of antennas having a first antenna and a second antenna disposed equidistantly from a third antenna. The system further includes a first transmit module connected to the first antenna and a second transmit module connected to the second antenna. The first antenna is associated with a first gain and a first phase and the second antenna is associated with a second gain and a second phase. The system further includes a receiver module in communication with the third antenna and a signal generator in communication with the first and second transmit modules and configured to generate a calibration reference signal. The signal generator generates the calibration reference signal. The first antenna transmits the calibration reference signal, the second antenna transmits the calibration reference signal, and the third antenna receives a first reference signal corresponding to the calibration reference signal transmitted by the first antenna and a second reference signal corresponding to the calibration reference signal transmitted by the second antenna. The receiver module is configured to adjust the second gain and the second phase associated with the second antenna to match the first gain and the first phase associated with the first antenna by comparing the first reference signal received by the third antenna with the second reference signal received by the third antenna.

This aspect may include one or more of the following optional features. In some examples, the system includes a peak detector in communication with the receiver module. The peak detector receives a summation of the first reference signal and the second reference signal. The receiver module is configured to adjust the second phase and/or the second gain based on an output of the peak detector. The receiver module may be configured to adjust the second phase so that the output of the peak detector is maximized. The receiver module may be further configured to adjust the second gain so that the output of the peak detector is minimized when the first phase is shifted by 180 degrees. The receiver module may be further configured to amplify the corresponding received referenced signal.

In some implementations, the system further includes a summer in communication with the receiver module, the summer summing the first reference signal and the second reference signal. The system further includes an analog-to-digital converter in communication with the peak detector and configured to output a signal in relation to the output of the peak detector. The signal generator may include a phase locked loop. The first antenna, second antenna and third antenna may be connected to a modem. In some examples, the system includes an integrated circuit integrating thereon the first transmit module, the second transmit module, and the receiver module.

In some examples, the system includes a second transmit module connected to the second antenna. The second transmit module is associated with a transmit gain and a transmit phase. The second receiver may be calibrated to the second transmit module by connecting the second receiver to the second transmit module and adjusting the second gain and the second phase associated with the second transmit module to match the second gain and the second phase associated with the second receiver module.

Yet another aspect of the disclosure provides a method for utilizing a phased array antenna system. The method includes generating a first reference signal, transmitting the first reference signal from a first antenna, and receiving a second reference signal at a second antenna corresponding to the first reference signal transmitted by the first antenna. The second antenna is associated with a first gain and a first phase. The method includes receiving a third reference signal at a third antenna corresponding to the first reference signal transmitted by the first antenna. The third antenna is associated with a second gain and a second phase, and the second and third antennas are located equidistantly from the first antenna. The method further includes adjusting the second gain and the second phase associated with the third antenna to match the first gain and the first phase associated with the second antenna by comparing the second reference signal received by the second antenna with the third reference signal received by the third antenna.

This aspect may include one or more of the following optional features. In some implementations, the method includes summing the second and third reference signals, receiving the summed second and third reference signals in a peak detector, and adjusting the second phase and/or the second gain based on an output of the peak detector. The method may include adjusting the second phase so that the output of the peak detector is maximized. The method may further include shifting the first phase by 180 degrees and adjusting the second gain so that the output of the peak detector is minimized. The method may also include amplifying the second and third reference signals.

Yet another aspect of the disclosure provides a second method for utilizing a phased array antenna system. The method includes generating a calibration reference signal, transmitting the calibration reference signal from a first antenna, and transmitting the calibration reference signal from a second antenna. The first antenna is associated with a first gain and a first phase, and the second antenna is associated with a second gain and a first phase. The method further includes receiving a first reference signal at a third antenna corresponding to the calibration reference signal transmitted by the first antenna and receiving a second reference signal at the third antenna corresponding to the calibration reference signal transmitted by the first antenna. The third antenna is located equidistantly from the first and second antennas. The method further includes adjusting the second gain and the second phase associated with the second antenna to match the first gain and the first phase associated with the first antenna by comparing the first reference signal received by the third antenna with the second reference signal received by the third antenna.

This aspect may include one or more of the following optional features. In some examples, the method includes summing the first and second reference signals, receiving the summed first and second reference signals in a peak detector and adjusting the second phase and/or the second gain based on an output of the peak detector. The method may include adjusting the second phase so that the output of the peak detector is maximized. The method may further include shifting the first phase by 180 degrees and adjusting the second gain so that the output of the peak detector is minimized. The method further includes amplifying the first and second reference signals.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 7 is a schematic view of an exemplary layout of an antenna in a phased antenna array.

FIG. 8 is a schematic view of an alternative exemplary layout of an antenna in a phased antenna array.

Like reference symbols in the various drawings indicate like elements.

DETAILED DESCRIPTION

In radio transmission systems, an array of antennas can be used to increase the ability to communicate at greater range and/or increase antenna gain in a direction over individual elements. In a phased array antenna, the phase of individual elements may be adjusted to shape the area of coverage, resulting in longer transmissions or steering the transmission direction without physically moving the array. The shape of the coverage may be adjusted by the alteration of individual elements transmission phase and gain in the array.

Figure 1:
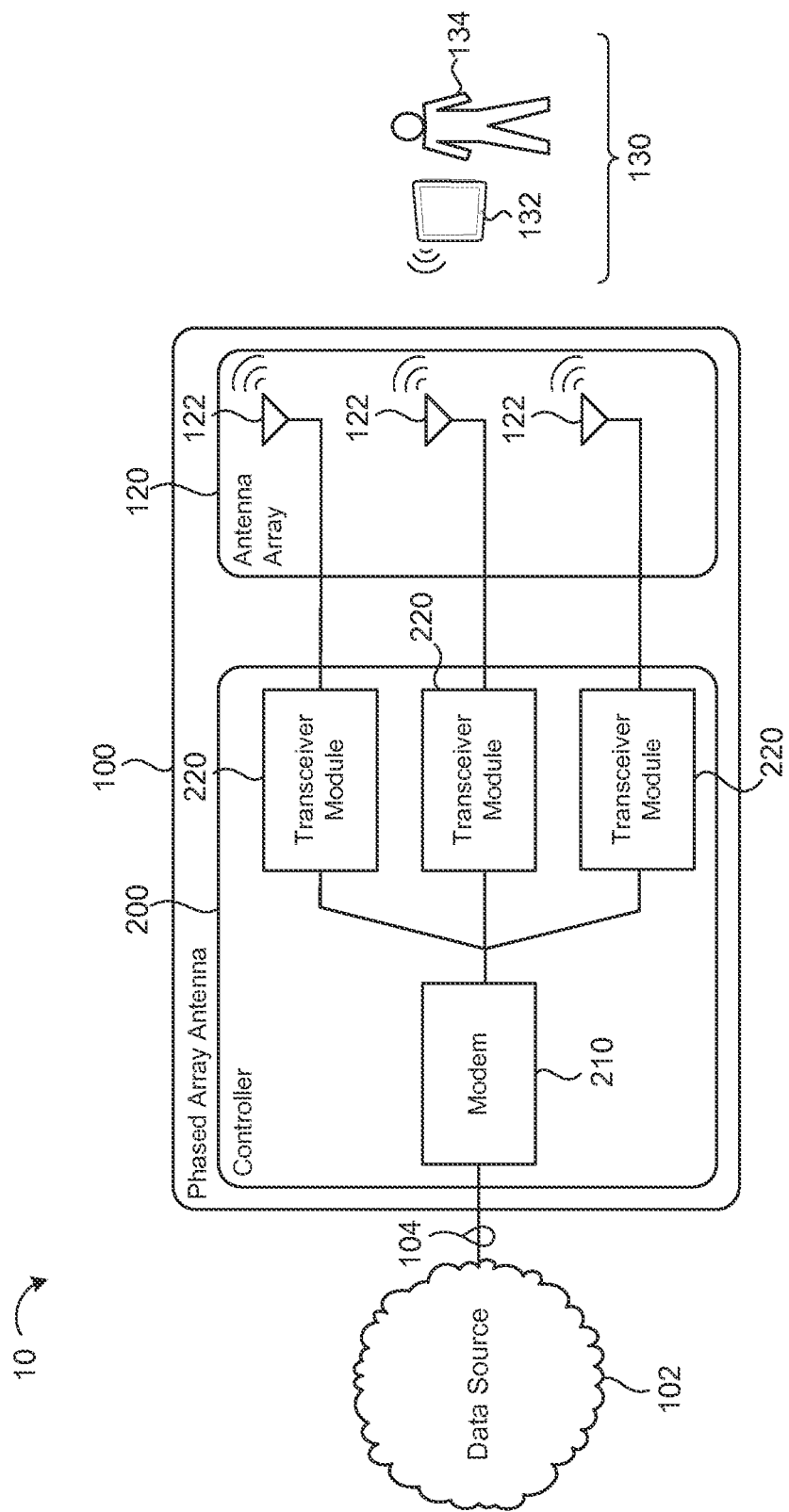
FIG. 1 provides a schematic view of an example architecture of a phased antenna array system.

FIG. 1 provides a schematic view of an example phased array antenna system 10. The phased array antenna system 10 includes a phased array antenna 100 in communication with a data source 102 and a remote system 130. In the example shown, the phased array antenna 100 includes a controller 200 in communication with an antenna array 120 composed of a plurality of antennas 122. The controller 200 includes a modem 210 in communication with a plurality of transceiver modules 220. The modem 210 receives data 104 from the data source 102 converts the data 104 into a form suitable to be transmitted to the antenna array 120. For example, the modem 210 converts the data 104 to a signal for transmission or receipt by the transceiver module 220 via electromagnetic energy or radio signals. The antenna array 120 may transmit the electromagnetic energy over the air for receipt by the remote systems 130. The remote systems 130 may include a transceiver device 132 associated a user 134. The phased array antenna system 10 can also operate in the reverse order, with the remote system 130 transmitting electromagnetic energy to the antenna array 120, which the controller 200 converts to data 104.

Figure 2:
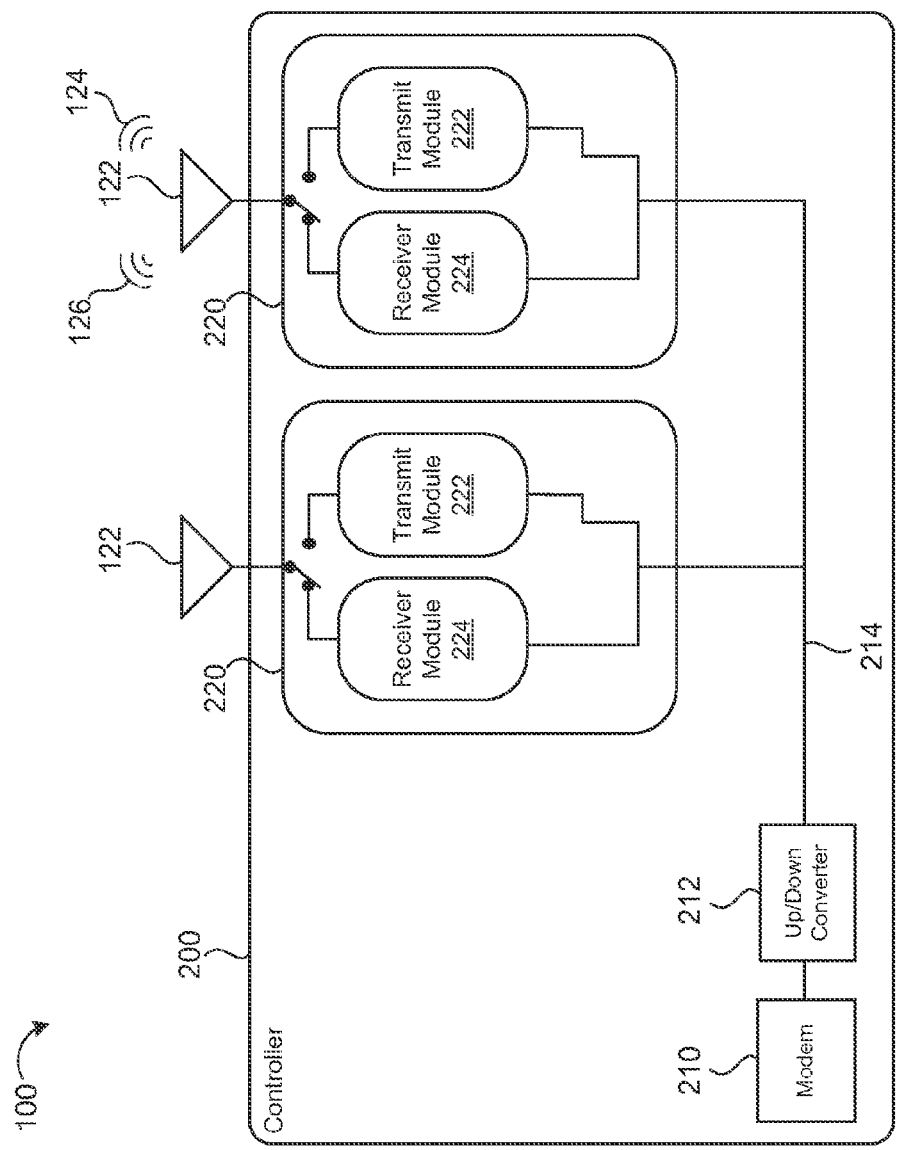
FIG. 2 is a schematic view of an example phased antenna array.

FIG. 2 provides a schematic view of an example phased array antenna 100 including a controller 200, which includes a modem 210 to receive data 104. The data 104 is transferred by the modem 210 to an up down converter 212. The up down converter 212 converts the signal from a data based form into a digitized real signal centered at an intermediate frequency to a baseband complex signal centered at zero frequency or the reverse. Upon this conversion, the up down converter 212 sends the signal via a corporate feed 214 to at least one or more transceivers modules 220, which send or receive the signal via the corresponding antenna 122. The phased array antenna 100 includes the combination of the plurality of the antenna 122 and the transceiver modules 220. Contained within the transceiver module 220 is a transmit module 222 and receiver module 224, which can be connected to the antenna 122 depending on if the transceiver is required to transmit or receive. The antenna 122 transmits electromagnetic energy with a phase 124 and a gain 126. The gain 126 is representative of the power or peak height of the electromagnetic wave. The phase 124 is representative of the fraction of the electromagnetic signal wave in relation to an arbitrary origin point.

Figure 3:
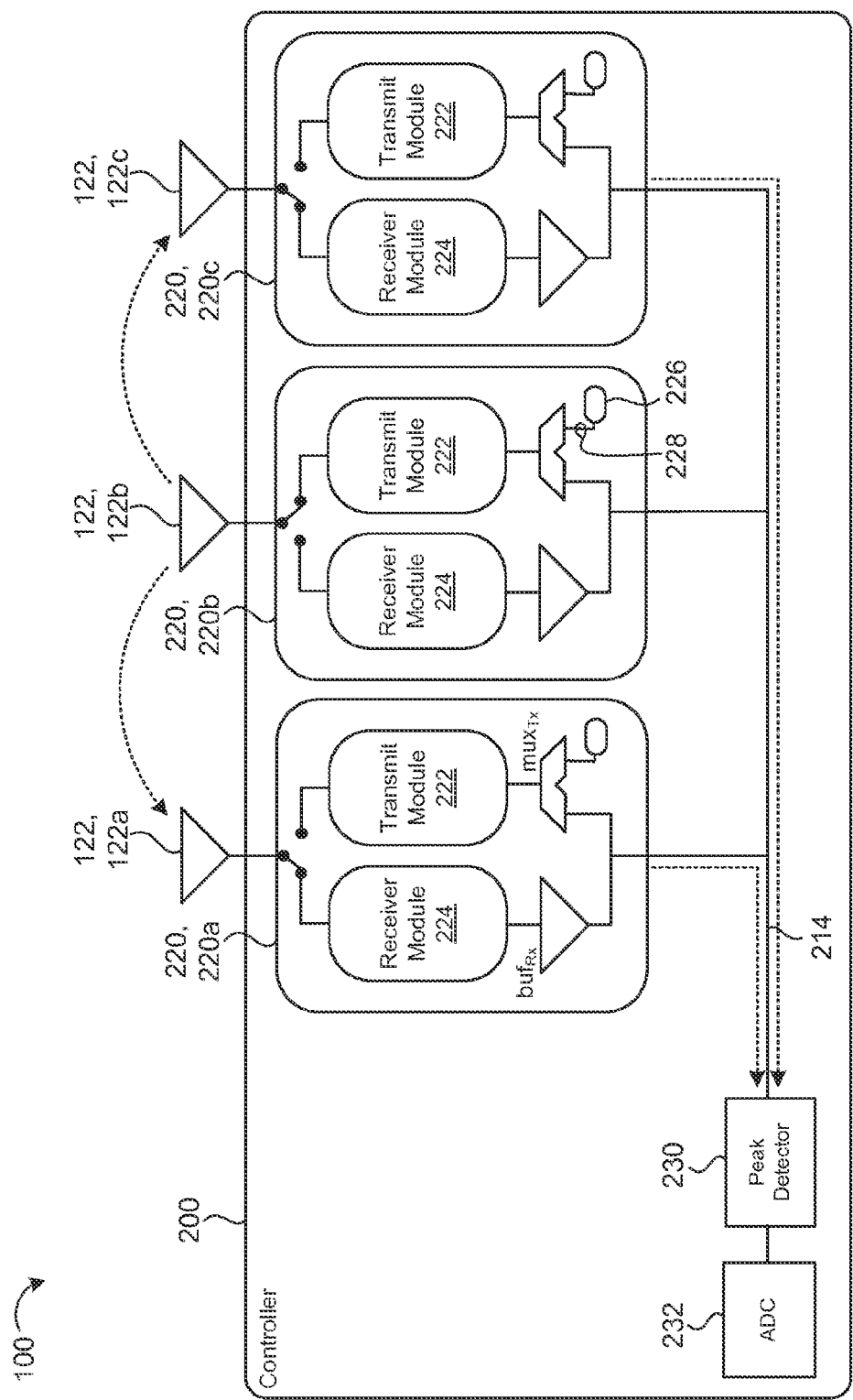
FIG. 3 is a schematic view of an example phased antenna array configured for calibrating receivers in the phased antenna array.
Figure 4:
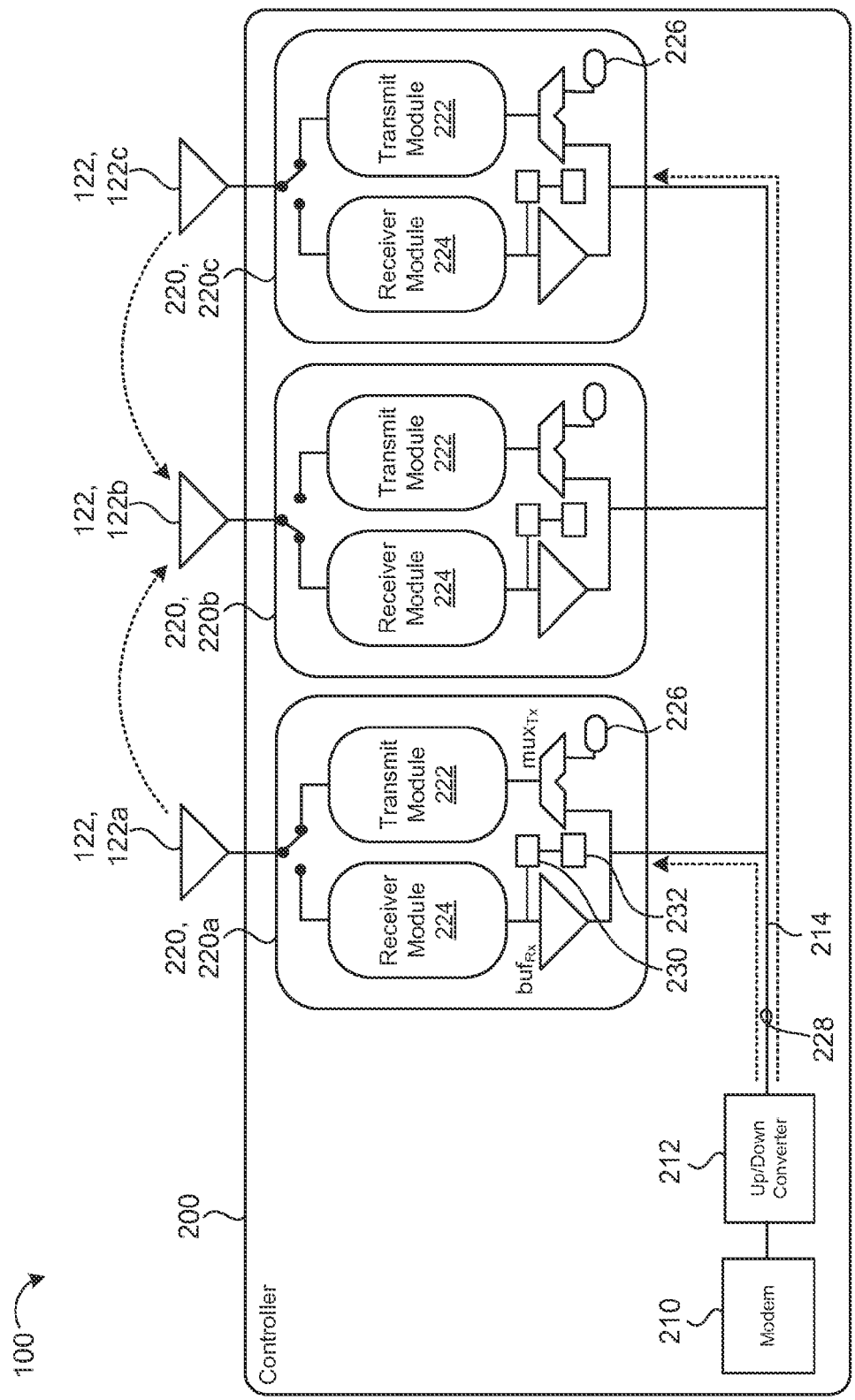
FIG. 4 is a schematic view of an example phased antenna array configured for calibrating transmitters in the phased antenna array.

FIG. 3 provides a schematic view of an example phased array antenna 100 including a plurality of transceiver modules 220, 220a . . . 220c configured to calibrate the received phase 124 and gain 126 of one antenna 122 in the phased array antenna 100. Each transceiver module 220 includes a signal generator 226 connected to the transmit module 224. The signal generator 226 may be any system that can provide an appropriate signal for the transmit module 224, such as a phase lock loop (PLL) 226. For the purposes of this application, the examples within the signal generator 226 will be referred to as a phase lock loop (PLL) 226. The PLL 226 is capable of generating a constant frequency output to be used for calibration and to output a reference signal 228 in order to provide phase 124 measurements. In some examples, the corporate feed 214 is connected from each of the transceiver modules 220 to a digital baseband. A peak detector 230 may be implemented the digital baseband. The peak detector 230 is connected to an analog to digital converter (ADC) 232. A peak detector 230 may be a diode and capacitor connected in series to output the DC voltage representative of a maximum peak of an applied alternating current signal or carrier wave. The DC voltage output by the peak detector 230 may be converted by the ADC 232 to give a signal to a computer to determine the current peak voltage being output by a signal. Moreover, the peak detector 230 may be a digital peak detector in the digital baseband or an analog peak detector. In other examples, the corporate feed 214 is connected from each of the transceiver modules 220 to an up/down converter 212, which is connected to a modem (e.g., as shown in FIG. 4). In some examples, the transceiver modules 220, 220a . . . 220c are integrated on an integrated chip (IC), which reduces the amount of calibration hardware needed for calibrating the phased array antenna 100.

In some examples, a method of calibrating the phase 124 of the phased array antenna 100 includes selecting a first transceiver 220a and a corresponding first antenna 122a as a reference set having a corresponding phase 124 and gain 126. The first antenna 122a is a certain distance from a second antenna 122b. The method also includes selecting a third transceiver 220c and a corresponding third antenna 122c as a calibration set to have their phase 124 and gain 126 adjusted to match the reference set. The first and third antennas 122a, 122c are connected to the first and third transceiver modules 220a, 220c, respectively, and are located an equal distance away from the second antenna 122b, which is connected to the second transceiver module 220b, and therefore have mutual coupling. The second transceiver module 220b is configured to transmit mode. The PLL 226 of the second transceiver module 220b may feed a continuous RF frequency to the attached antenna 122b to be used in the calibration. Both the first and third transceiver modules 220a, 220c output the received signal broadcast from the second transceiver module 220b to the corporate feed 214. The greater the difference in phase 124 of the signal received by the first transceiver module 220a or the third transceiver module 220c, the greater the cancellation of the signal, resulting in a lower amplitude signal to the peak detector 230. The calibration is executed by adjusting the phase 124 output of the third transceiver module 220c until the maximum signal is received on the corporate feed 214. The maximum signal correlates to the highest peak voltage of the signal and therefore the peak detector 230 outputs a maximum voltage to the ADC 232. When the signal output from the peak detector 230 is at maximum, the two signals being received by the first and third transceiver modules 220a, 220c are closest in matching phase 124 to the signal being transmitted by the second transceiver module 220b, signaling maximum phase 124 alignment. As previously discussed, the peak detector 230 may be a phase detector for either digital or analog implementations.

Upon completion of the first phase 124 calibration, the gain 126 of the system 100 may be calibrated by adjusting the phase 124 received by the first transceiver module 220a to be 180 degrees from its original configuration. The gain 126 or amplitude of the output signal of the third transceiver module 220c is then adjusted until the peak detector 230 output is minimized. A complete cancellation of signals occurs when two received signals are perfectly 180 degrees out of phase 124 from each other and of equal amplitude. In the event that one of the signals has higher amplitude than the other signal, there would be a residual part of the signal that was not cancelled, allowing the peak detector 230 to show an output greater than zero. To complete the calibration of the third transceiver module 220c and the corresponding third antenna 122c, the method includes adjusting the gain 126 of the signal to minimize the output of the peak detector 230 during the time which the first transceiver module 220a is outputting a 180 degree reverse phase 124 signal. The calibration processes for the receiver modules 224 described above may be repeated across a plurality of antenna 122 and transceiver modules 220 to ensure that the received signal of each of the transceiver modules 220 matches the reference transceiver 220a.

FIG. 4 provides a schematic view of an example phased array antenna 100 that includes a plurality of transceiver modules 220, 220a . . . 220c configured to calibrate the transmitted phase 124 and gain 126 of one antenna 122 in the phased array antenna 100. In some examples, the peak detector 230 and ADC 232 are located within the transceiver module 220. This provides a simpler system than switching hardware to change the corporate feed 214 from the up down converter 212 and modem 210 to the peak detector 230 and ADC 232. In some examples, calibrating a transmitter pair within the phased array antenna 100 includes selecting a first antenna 122a and a first transceiver module 220a to be used as a reference and configuring them for a transmission. The method of calibration also includes selecting a second antenna 122b and a second transceiver module 220b as a receiving monitor for the calibration and configuring them in a receiving configuration. The method of calibration includes identifying a third antenna 122c and a third transceiver module 220c to be calibrated to match the phase 124 and gain 126 of the reference antenna 122a and transceiver module 220a. The first and third transceiver modules 220a, 220c both output a common reference signal 228 generated by the modem 210 and distributed to the transceiver modules 220a, 220c through the corporate feed 214. The respective antennas 122a, 122c of the transceiver modules 220a, 220c transmit the reference signal 228. If the on-chip PLLs 226 of the first and third transceiver modules 220a, 220c generate reference signals 228, there would be phase and gain ambiguity in the two different PLLs 226. By generating the common reference signal 228 at the modem 210 and distributing the common reference signal 228 through the corporate feed, the common reference signal 228 has no phase or gain ambiguity.

As both the first and third antennas 122a, 122c are the same distance physically away from the receiving second antenna 122b, there is equal mutual coupling that may occur. Due to the mutual coupling, the phase 124 and amplitude of the transmitted signal may arrive at the same time and with equal interference to the receiving second antenna 122b. As the signals emanating from the first and third antenna 122a, 122c interfere with each other, any difference in phase 124 may cancel the other signal. While both the first and third antenna 122a, 122c are transmitting, the method includes adjusting the third transceiver 220b for phase. As with before, when the two signals are in closest phase 124 alignment, there may be the least amount of cancellation between the two signals, allowing for the peak detector 230 located within the second transceiver 220b to receive the maximum DC output of the peak detector 230 to the ADC 232. After the third transceiver 220c has been adjusted to match the phase 124 of the reference transceiver 220a, it may then be adjusted for gain 126. The signal from the first transceiver 220a is then phase 124 adjusted 180 degrees from its previous output. This results in the signal from the third transceiver 220c canceling out the signal from the first transceiver 220a that is received by the second transceiver 220b. The method includes adjusting the gain 126 of the third transceiver 220c so that the peak detector 230 contained within the second transceiver 220b has a minimum output. The minimum output results in the closest matching gain 126 between the first transceiver 220a and the third transceiver 220b. The aforementioned calibration processes for transmitters may be repeated across a plurality of antenna 122 and transceivers modules 220 to ensure that the output of each of the transceivers modules 220 matches the reference transceiver module 220a.

Figure 5:
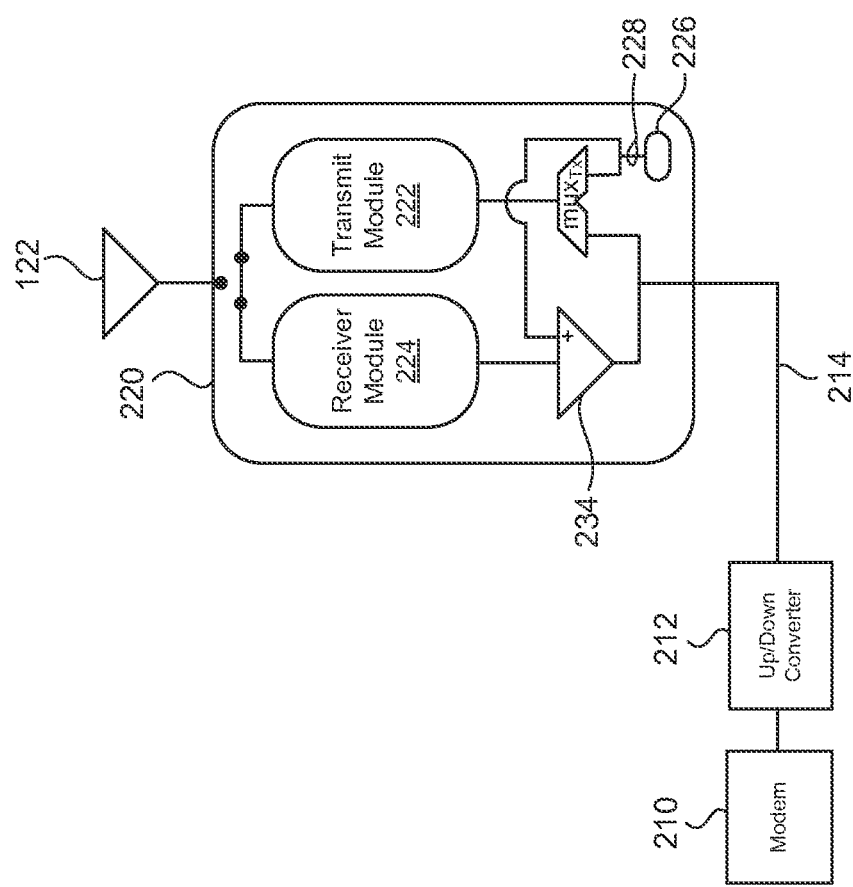
FIG. 5 is a schematic view of an example antenna module configured for loopback calibration for phase.

FIG. 5 shows a schematic view of an example transceiver module 220 configured to perform a loopback calibration. In some examples, the transceiver module 220 includes a summer 234 configured to sum the signal 228 from the PLL 226 and the output of the receiver module 224 and output the sum to the corporate feed 214. The transmit module 224 may be calibrated by setting up the transceiver module 220 in a loopback configuration, by connecting the transmit module 224 directly to the receiver module 224 and bypassing the antenna 122. In this configuration, the PLL 226 outputs a reference signal 228 that is transmitted by the transmit module 222 and received by the receiver module 224. The signal is then added to the reference signal 228 from the PLL 226 and output to the corporate feed 214. The output of the summer 234 on the corporate feed 214 is then measured by the up down converter 212 and modem 210. When the output of the summer 234 is maximized, the phase 124 of the transmit module 222 and receiver module 224 are in phase 124 alignment. In some examples, the summer 234 subtracts the signals and the phase 124 matching may be indicated by minimizing the absolute value of the signals. The gain 126 of the transmit module 222 and the receiver module 224 may be calibrated to an absolute level by the summer 234 inverting the PLL 226 signal. The PLL 226 signal may be inverted or phase 124 shifted 180 degrees in the summer 234 and adjusting the output of the transmit module 222 until the output of the summer 234 is minimized, resulting in the gain 126 of the transmit module 222 being set to a relative level to the receiver module 224 gain 126.

Figure 6:
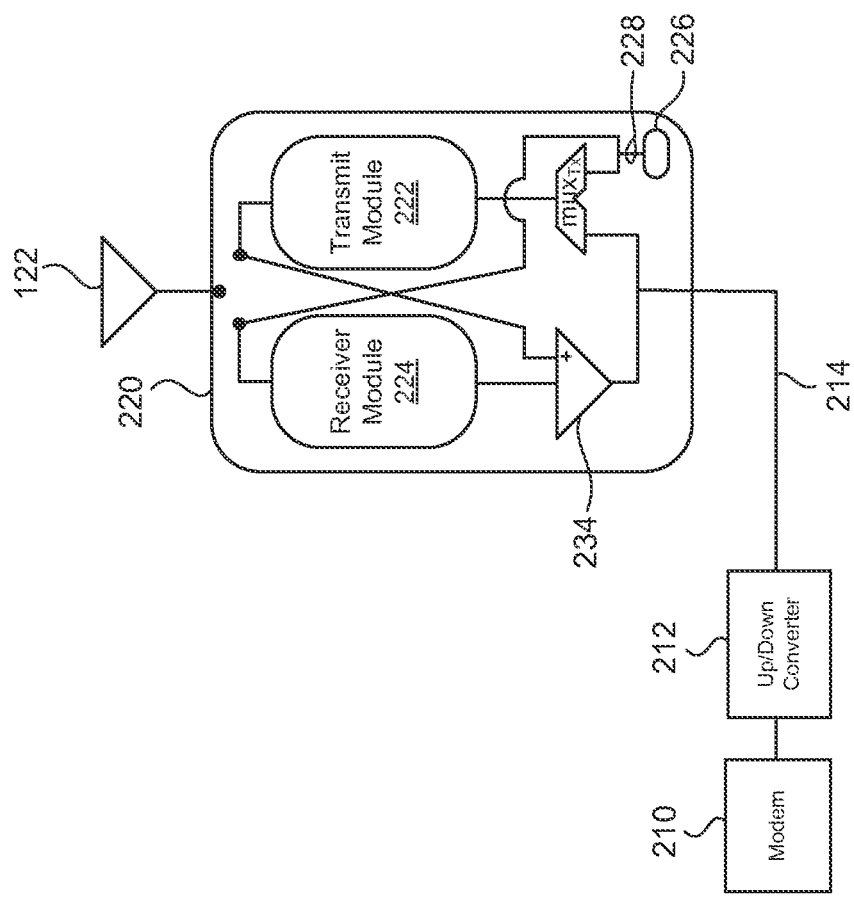
FIG. 6 is a schematic view of an example antenna module configured for loopback calibration for gain.

FIG. 6 shows a schematic view of an example transceiver module 220 in an alternative configuration to perform a loopback calibration. Generally, this calibration may be performed after one of the above phase 124 calibrations have been performed. The output of the PLL 226 is directed into the receiver module 224 and into the transmit module 222. In this configuration, the output of the transmit module 222 is connected directly to the summer 234. The summer 234 adds the output of the transmit module 222 and the output of the receiver module 224. By directly connecting the PLL 226 to the receiver module 224, a power or gain 126 measurement device can be established, because the PLL 226 output level is a known value and the output of the receiver module 224 based on the known value input of the PLL 226 is a known relationship. Once a desired known power output or gain 126 has been selected by the receiver module 224, the transmit module 222 power output or gain 126 can be matched. The signal output from the receiver module 224 is input to the summer 234 and phase shifted 180 degrees, then the signal is added to the output of the transmit module 222. The power of the transmit module 222 is then adjusted to minimize the output of the summer 234 resulting in the calibration of the transmit module 222 to a known power level.

Figure 7:
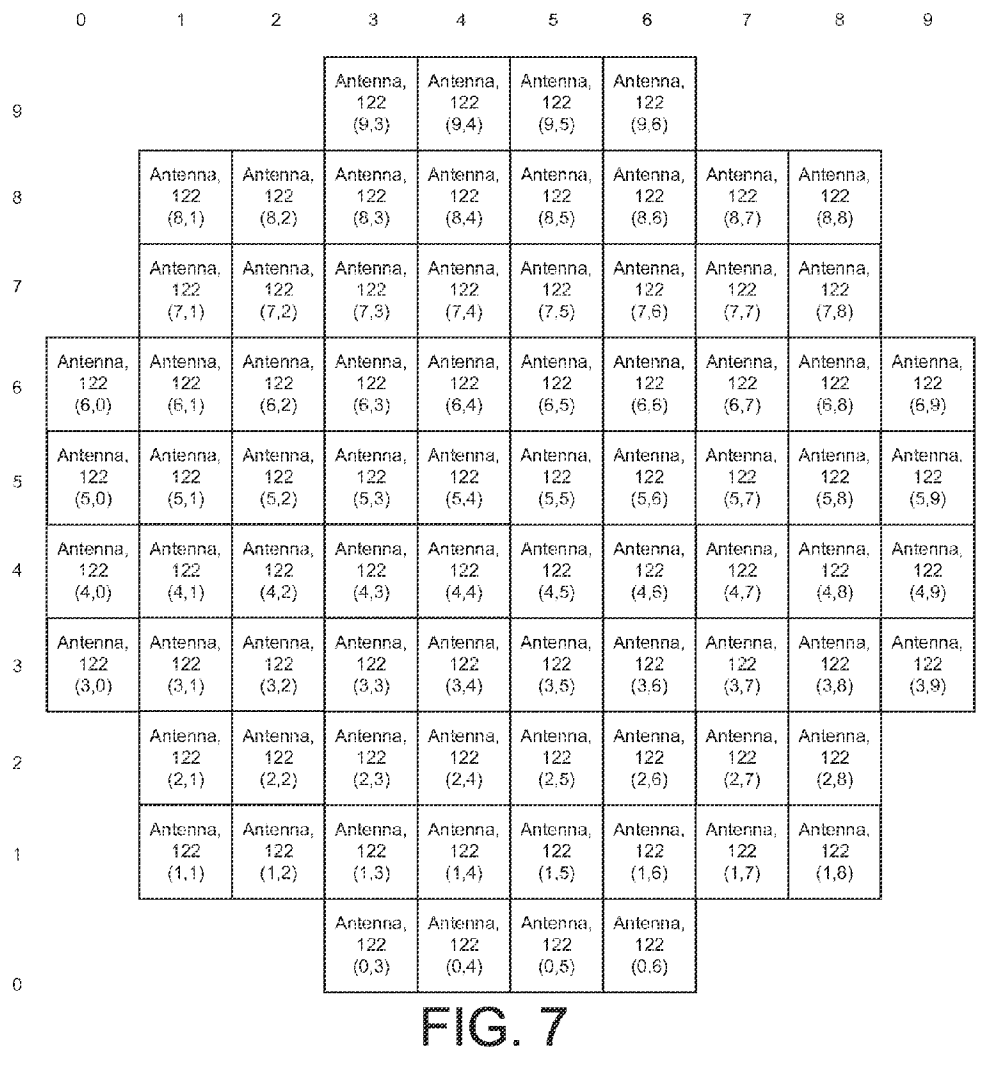

FIG. 7 shows a schematic view of an example antenna array 120 with a plurality of antennas 122. In this example, a square grid is used to lay out the antennas 122 to assist in ease of explanation and provide a grid number system. In some examples, any arrangement of antennas 122 is used, such as, but not limited to, circular, triangular, fractal, etc. In one example, antenna 122 (8,1) may be used as a starting point to calibrate antenna 122 (8,3) to match by using antenna 122 (8,2) as either the transmitting or receiving antenna 122. Next, antenna 122 (8,5) may be calibrated by match antenna 122 (8, 3) by using antenna (8,4). This may be repeated downward, with antenna 122 (8,1) being used to calibrate (6,1) to match by using antenna 122 (7,1) as the receiving or transmitting antenna. This process may be repeated across the antenna array 120 to calibrate antennas 122. In at least one example, multiple passes may be completed using different antennas 122 as a starting reference, and the results may be averaged to improve the consistency of the calibration across the system and eliminate any cumulative errors that occur between each calibration to the next.

Figure 8:
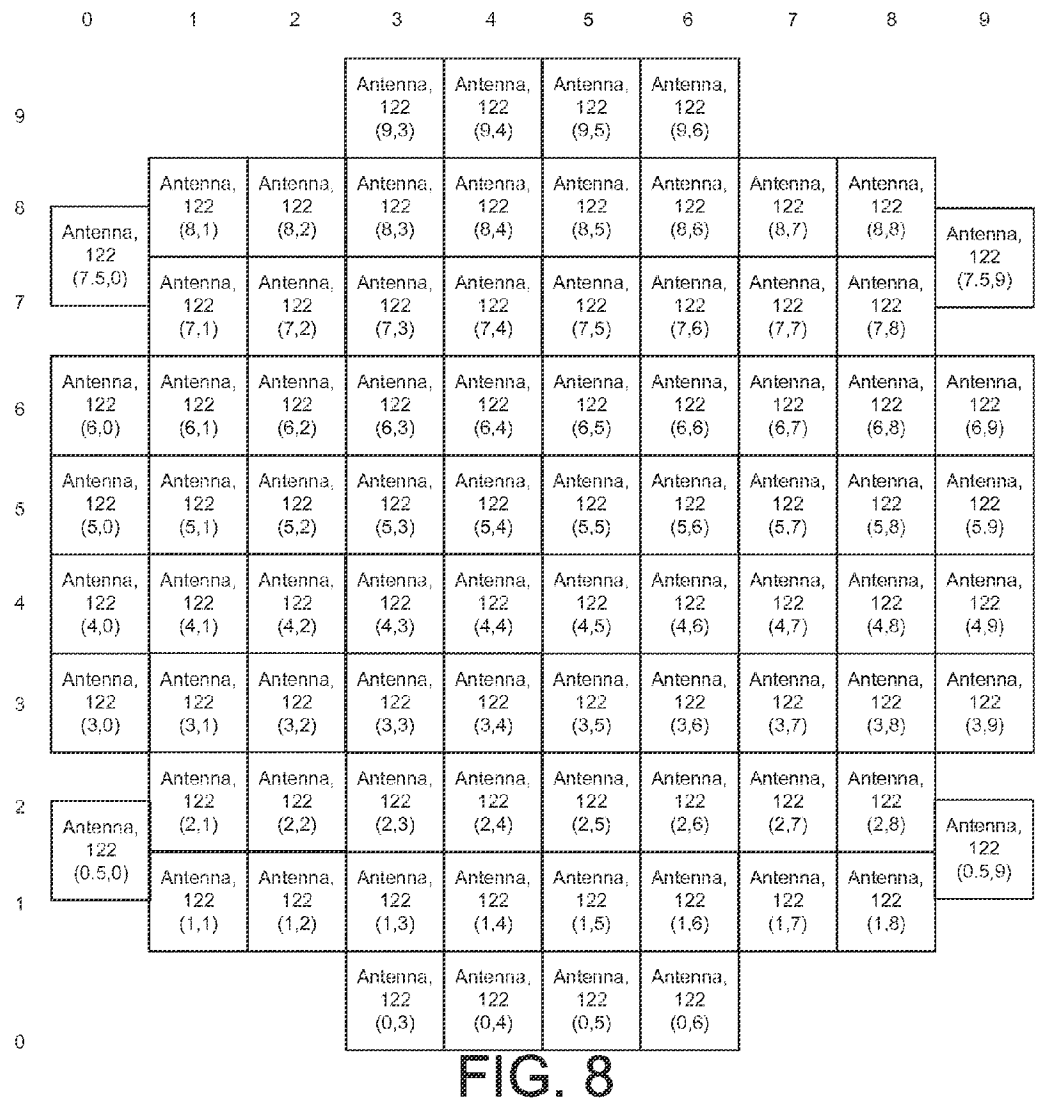

FIG. 8 shows a schematic view of an example antenna array 120 with a plurality of antennas 122. One challenge presented when using a square grid array of antennas 122 is that if antenna 122 (8,1) is selected as a starting point, antenna 122 (6,1) may be calibrated to match antenna 122 (8,1) using antenna 122 (7,1). As there is not an antenna 122 equidistant from both antenna 122 (8,1) and antenna 122

(7,1) in which to calibrate antenna 122 (7,1) to antenna 122 (8,1), each set of antennas 122 may have a different calibration value. This results in a checkerboard pattern, where two sets of antennas 122 are calibrated to a different reference antenna 122. One solution to this problem is to locate an additional antenna 122 equidistant between an antenna 122 on each grid. For example, an antenna 122 may be added at location (7.5,0) to act as an antenna 122 equidistant between antenna 122 (8,1) and antenna 122 (7,1) allowing them to be calibrated to each other. With the addition of antenna 122 (7.5,0) antenna 122 (8,1) may be calibrated to match antenna 122 (7,1) and all further calibrations can be to the same reference antenna 122. In some examples, multiple antennas 122 (7.5, 0), (0.5,0), (0.5,9), (7.5, 9) are used to provide additional cross reference when calibrating the grid. One additional solution to the problem of a lack of a reference element between the grid is to connect two antenna 122 to a single transceiver module 220 with multiple transmit modules 222 and multiple receive modules 224. A calibration may be performed by matching the output of the two transceivers 220 to each other and matching the difference in calibration.

Figure 9:
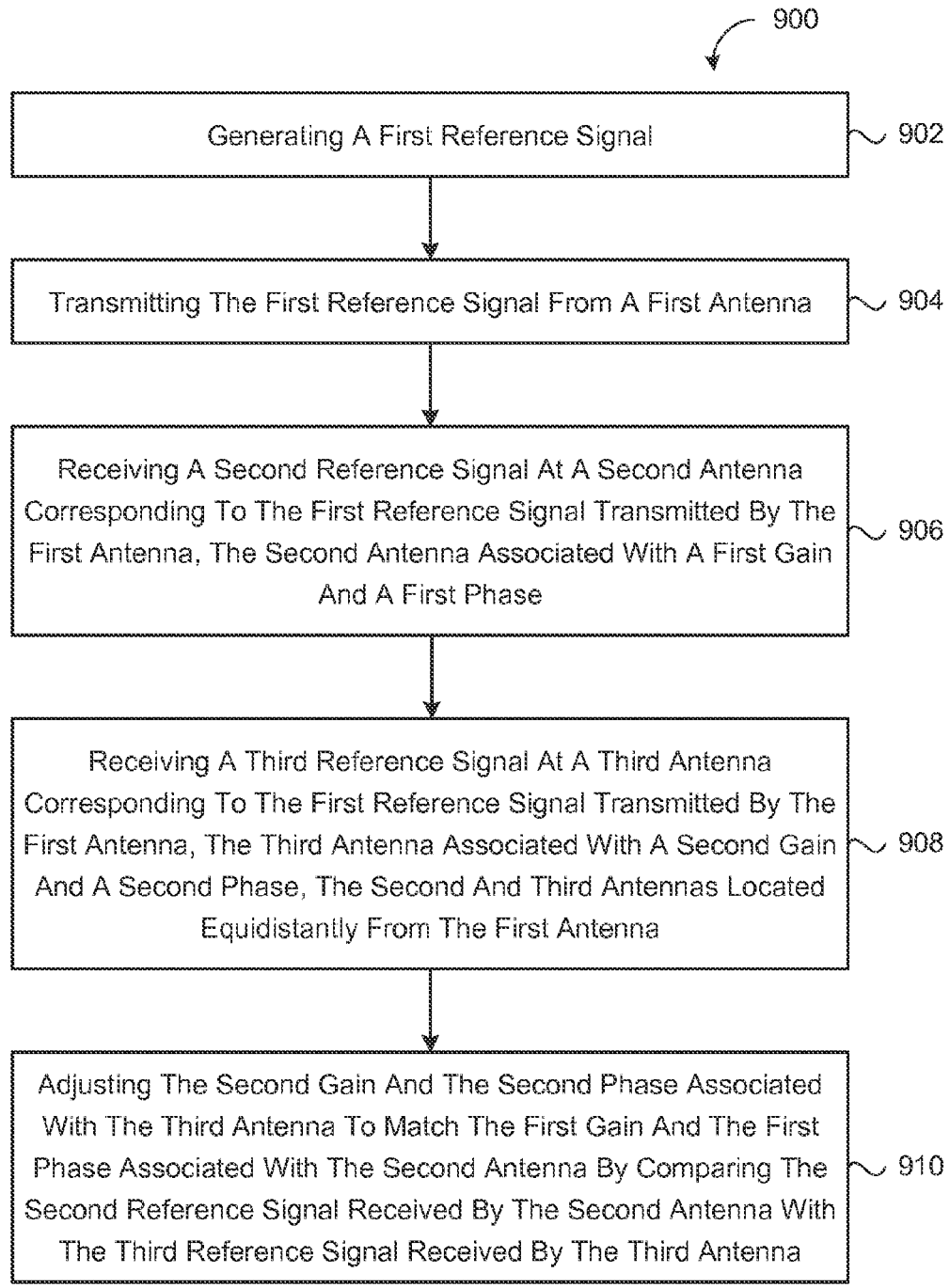
FIG. 9 is a schematic view of a method for calibrating receivers in a phased antenna array.

FIG. 9 shows a method 900 for calibrating the receiver module 224 in a phased array antenna 100. At block 902, the method 900 includes generating a first reference signal 228. The first reference signal 228 may be generated from a PLL 226 and may be any continuous signal that is in the appropriate frequency. At block 904, the method 900 includes transmitting the first reference signal 228 from a first antenna 122a. The reference signal 228 from the PLL 226 may be transmitted via a transmit module 222 to an antenna 122. At block 906, the method 900 includes receiving a second reference signal 228 at a second antenna 122b corresponding to the first reference signal 228 transmitted by the first antenna 122a, the second antenna 122b associated with a first gain 126 and a first phase 124. The second antenna 122b receives the reference signal 228 generated by the PLL 226 transmitted from the first antenna 122a via a receiver module 224. The receiver module 224 includes adjustments to adjust the phase 124 and gain 126 of the reference signal 228 that is being received by the second antenna 122. At block 908, the method 900 includes receiving a third reference signal 228 at a third antenna 122c corresponding to the first reference signal 228 transmitted by the first antenna 122a, the third antenna 122c associated with a second gain 126 and a second phase 124. The second and third antennas 122b, 122c are located equidistantly from the first antenna 122a. The third antenna 122c receives the reference signal 228 generated by the PLL 226 transmitted from the first antenna 122a via a receiver module 224. The receiver module 224 includes adjustments to adjust the phase 124 and gain 126 of the signal that is being received by the third antenna 122c. Both the second antenna 122b and third antenna 122c are located an equal distance from the first antenna 122a. This provides a mutual coupling and allowing any potential outside interference to be equal for both the second antenna 122b and third antenna 122c. At block 910, the method 900 includes adjusting the second gain 126 and the second phase 124 associated with the third antenna 122c to match the first gain 126 and the first phase 124 associated with the second antenna 122b by comparing the second reference signal 228 received by the second antenna 122b with the third reference signal 228 received by the third antenna 122c. As both the second antenna 122b and third antenna 122c are equal distance away from the first antenna 122a, the phase 124 of the received signal may progress the same amount from transmission to reception for both the second antenna 122b and third antenna 122c. The received reference signal 228 received on both the second antenna 122b and third antenna 122c are output through their respective receiver modules 224 and then combined. As with any two signals that are out of phase 124, a destructive cancellation occurs reducing the maximum peak output of the received signal. The receiver module 224 attached to the third antenna 122c second phase 124 output is then adjusted so that the maximum peak of the signal is detected. When the maximum peak of signal is detected, the second antenna 122b and third antenna 122c are closest in phase 124 alignment due to the minimum amount of destructive cancellation occurring. The first phase 124 output of the second antenna 122b attached receiver module 224 may then be shifted 180 degrees. The second gain of the third antenna's 122c attached receiver module 224 is then adjusted so that the peak output of the signal is minimized. Due to the destructive cancellation between the signals, when the signal being received from the third antenna's 122 attached receiver module 224 and combined with the 180 degree out of phase 124 signal from the second antenna's 122b attached receiver module 224, the second gain of the third antenna 122c is minimized, the signals are as close to being equal in gain as can be reached with the equipment and available adjustment.

Figure 10:
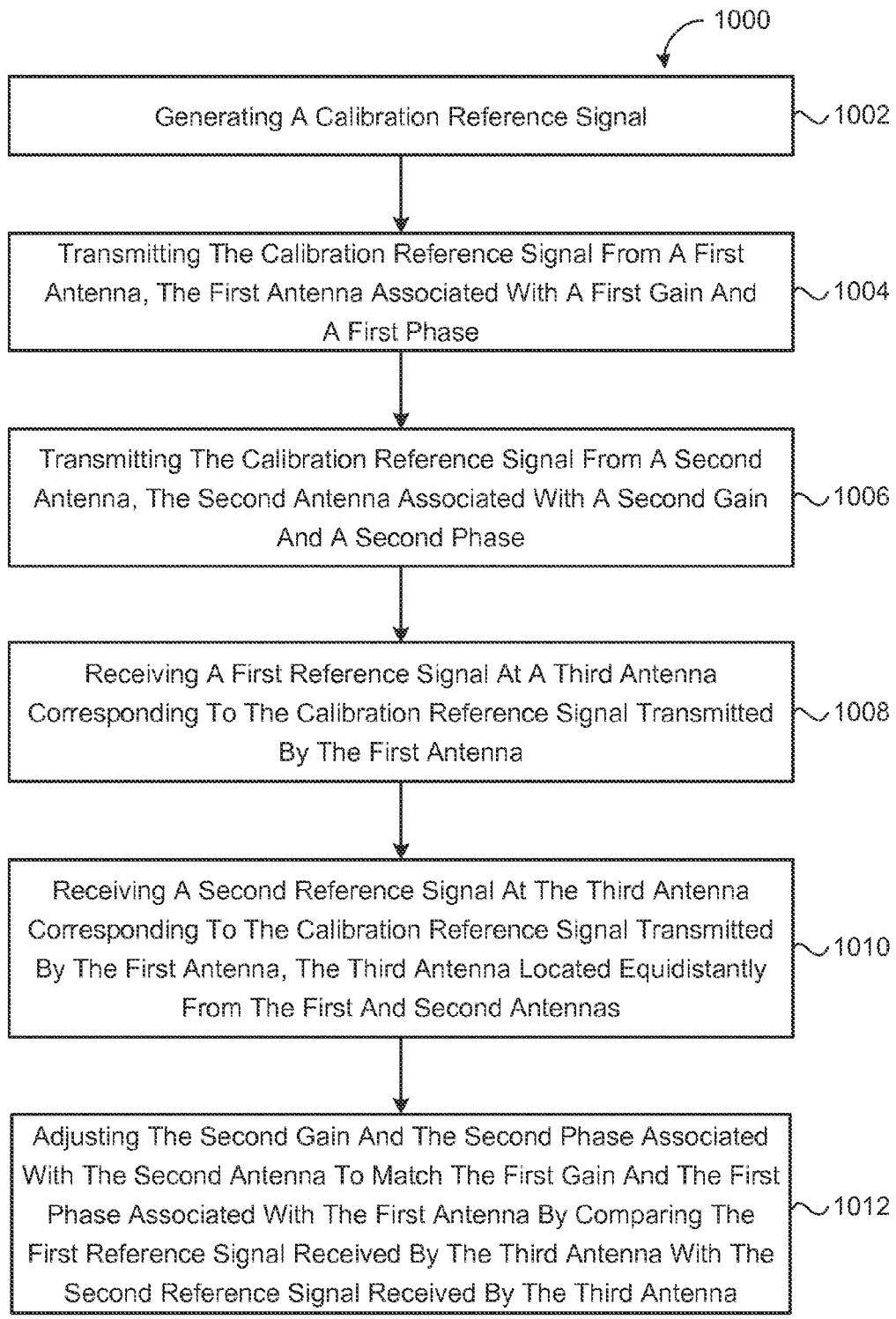
FIG. 10 is a schematic view of a method for calibrating transmitters in a phased antenna array.

FIG. 10 shows a method 1000 for calibrating the transmit module 222 in a phased array antenna 100. At block 1002, the method 1000 includes generating a calibration reference signal 228. The calibration reference signal 228 may be generated from a common source, such as a common PLL 226 or a modem 210, and may be any continuous signal that is in the appropriate frequency. At block 1004, the method 1000 includes transmitting the calibration reference signal 228 from a first antenna 122a, which is associated with a first gain 126 and a first phase 124. The reference signal 228 from the common source (e.g., modem 210) may be transmitted via a transmit module 222 to the first antenna 122a. At block 1006, the method 1000 includes transmitting the calibration reference signal 228 from a second antenna 122b, which is associated with a second gain 126 and a second phase 124. The reference signal 228 from the common source (e.g., modem 210) may be transmitted via a transmit module 222 to the second antenna 122b. The reference signal 228 may be generated from the same PLL 226 that is delivering the reference signal 228 to the first antenna 122a or may be a modem 210 that is set to deliver a reference signal 228 at the same frequency. At block 1008, the method 1000 includes receiving a first reference signal 228 at a third antenna 122c corresponding to the calibration reference signal 228 transmitted by the first antenna 122a. The reference signal 228 generated by the common source (e.g., modem 210) may be received by a third antenna 122c connected to a receiver module 224. At block 1010, the method 1000 includes receiving a second reference signal 228 at the third antenna 122c corresponding to the calibration reference signal 228 transmitted by the first antenna 122a, the third antenna 122c located equidistantly from the first and second antennas 122a, 122b. The reference signal 228 from the common source (e.g., modem 210) and transmitted by the second antenna 122b is received at the third antenna 122c and its associated receiver module 224. The first antenna 122a and second antenna 122b must be an equal distance away from the third antenna 122c. By the first antenna 122a and second antenna 122b being an equal distance away from the third antenna 122c, the reference signals 228 transmitted by the first antenna 122a and second antenna 122b may combine. At block 1012, the method 1000 includes adjusting the second gain 126 and the second phase 124 associated with the second antenna 122b to match the first gain 126 and the first phase 124 associated with the first antenna 122a by comparing the first reference signal 228 received by the third antenna 122c with the second reference signal 228 received by the third antenna 122c. Any mismatch in phase 124 between the first antenna's 122 transmit module 222 and the second antenna's 122b combined reference signals 228 may destructively interfere resulting in a lower peak signal output from the third antenna 122. The second phase 124 of the second antenna 122b is then adjusted to result in the maximum peak of the reference signal received by the third antenna 122c. When the maximum peak occurs, there is minimal destructive interface and the first antenna 122a and second antenna 122b are matched in phase. The first antenna's 122a first phase 124 is then adjusted 180 degrees. When the first antenna 122a first phase 124 and second antenna 122b second phase 124 are 180 degree out of phase 124 and equal gain, output of the third antenna 122c is minimized. The greater the difference between the first gain 126 of the first antenna 122a and the second gain 126 of the second antenna 122b, the greater the reception of the reference signal may be the third antenna 122c. The second gain 126 of the second antenna 122b is then adjusted to minimize the reception of the reference signal 228 to the third antenna 122c.

In at least one example, the second and third reference signals 228 are summed together and sent to a peak detector 230. By summing the two reference signals 228 together and the addition of the two reference signals 228, any difference in phase 124 or gain 126 may be expressed as difference in output value. After the reference signal 228 has been summed, a peak detector 230 may output the highest voltage of transient waveform in a DC current form. When adjusting the phase 124, the summed reference signals 228 output to the peak detector 230 indicates maximum phase 124 alignment when the peak detector 230 output is maximized. The gain 126 may be adjusted by shifting the phase 124 of one of the reference signals 228 180 degrees. After the phase 124 of the reference signal 228 has been shifted, the two reference signals 228 may be summed and sent to the peak detector 230. The gain 126 of the two reference signals 228 may then be adjusted and is similar when the output of the peak detector 230 is minimized. In at least one example, the reference signal 228 may be amplified and allow for different power level adjustments.

A number of implementations have been described. Nevertheless, it will be understood that various modifications may be made without departing from the spirit and scope of the disclosure. Accordingly, other implementations are within the scope of the following claims.

What is claimed is:

1. A phased array antenna system comprising:
an array of antennas having a first antenna and a second antenna disposed equidistantly from a third antenna;
a first receiver module connected to the first antenna, the first antenna associated with a first gain and a first phase;
a second receiver module connected to the second antenna, the second antenna associated with a second gain and a second phase;
a transmit module in communication with the third antenna; and
a signal generator in communication with the transmit module and configured to generate a calibration reference signal,
wherein when the signal generator generates the calibration reference signal, the third antenna transmits the calibration reference signal, the first antenna receives a first reference signal corresponding to the calibration reference signal transmitted by the third antenna, and the second antenna receives a second reference signal corresponding to the calibration reference signal transmitted by the third antenna, and wherein the second receiver module is configured to adjust the second gain and the second phase associated with the second antenna to match the first gain and the first phase associated with the first antenna by comparing the first reference signal received by the first antenna with the second reference signal received by the second antenna.

2. The phased array antenna system of claim 1, further comprising a peak detector in communication with the first receiver module and the second receiver module, the peak detector receiving a summation of the first reference signal and the second reference signal, the second receiver module configured to adjust the second phase and/or the second gain based on an output of the peak detector.

3. The phased array antenna system of claim 2, wherein the second receiver module is configured to adjust the second phase so that the output of the peak detector is maximized.

4. The phased array antenna system of claim 2, wherein the second receiver module is configured to adjust the second gain so that the output of the peak detector is minimized when the first phase is shifted 180 degrees.

5. The phased array antenna system of claim 2, wherein each receiver module is configured to amplify the corresponding received referenced signal.

6. The phased array antenna system of claim 2, further comprising a summer in communication with the first receiver module and the second receiver module, the summer summing the first reference signal and the second reference signal.

7. The phased array antenna system of claim 2, further comprising an analog-to-digital converter in communication with the peak detector and configured to output a signal in relation to the output of the peak detector.

8. The phased array antenna system of claim 1, further comprising an integrated circuit integrating thereon the first receiver module, the second receiver module, and the transmit module.

9. The phased array antenna system of claim 1, wherein the first antenna, second antenna and third antenna are connected to a modem.

10. The phased array antenna system of claim 1, further comprising a second transmit module connected to the second antenna, the second transmit module associated with a transmit gain and a transmit phase, wherein the second receiver is calibrated to the second transmit module by connecting the second receiver to the second transmit module and adjusting the second gain and the second phase associated with the second transmit module to match the second gain and the second phase associated with the second receiver module.

11. A phased array antenna system comprising:
an array of antennas having a first antenna and a second antenna disposed equidistantly from a third antenna;
a first transmit module connected to the first antenna, the first antenna associated with a first gain and a first phase;
a second transmit module connected to the second antenna, the second antenna associated with a second gain and a second phase;
a receiver module in communication with the third antenna; and
a signal generator in communication with the first and second transmit modules and configured to generate a calibration reference signal,
wherein when the signal generator generates the calibration reference signal, the first antenna transmits the calibration reference signal, the second antennas transmits the calibration reference signal, and the third antenna receives a first reference signal corresponding to the calibration reference signal transmitted by the first antenna and a second reference signal corresponding to the calibration reference signal transmitted by the second antenna, and wherein when the receiver module is configured to adjust the second gain and the second phase associated with the second antenna to match the first gain and the first phase associated with the first antenna by comparing the first reference signal received by the third antenna with the second reference signal received by the third antenna.

12. The phased array antenna system of claim 11, further comprising a peak detector in communication with the receiver module, the peak detector receiving a summation of the first reference signal and the second reference signal, the receiver module configured to adjust the second phase and/or the second gain based on an output of the peak detector.

13. The phased array antenna system of claim 12, wherein the receiver module is configured to adjust the second phase so that the output of the peak detector is maximized.

14. The phased array antenna system of claim 12, wherein the receiver module is configured to adjust the second gain so that the output of the peak detector is minimized when the first phase is shifted 180 degrees.

15. The phased array antenna system of claim 12, wherein the receiver module is configured to amplify the corresponding received referenced signal.

16. The phased array antenna system of claim 12, further comprising a summer in communication with the receiver module, the summer summing the first reference signal and the second reference signal.

17. The phased array antenna system of claim 12, further comprising an analog-to-digital converter in communication with the peak detector and configured to output a signal in relation to the output of the peak detector.

18. The phased array antenna system of claim 11, further comprising an integrated circuit integrating thereon the first transmit module, the second transmit module, and the receiver module.

19. The phased array antenna system of claim 11, wherein the first antenna, second antenna and third antenna are connected to a modem.

20. The phased array antenna system of claim 11, further comprising a second transmit module connected to the second antenna, the second transmit module associated with a transmit gain and a transmit phase, wherein the second receiver is calibrated to the second transmit module by connecting the second receiver to the second transmit module and adjusting the second gain and the second phase associated with the second transmit module to match the second gain and the second phase associated with the second receiver module.

21. A method comprising:
generating a first reference signal;
transmitting the first reference signal from a first antenna;
receiving a second reference signal at a second antenna corresponding to the first reference signal transmitted by the first antenna, the second antenna associated with a first gain and a first phase;
receiving a third reference signal at a third antenna corresponding to the first reference signal transmitted by the first antenna, the third antenna associated with a second gain and a second phase, the second and third antennas located equidistantly from the first antenna; and adjusting the second gain and the second phase associated with the third antenna to match the first gain and the first phase associated with the second antenna by comparing the second reference signal received by the second antenna with the third reference signal received by the third antenna.

22. The method of claim 21, further comprising:
summing the second and third reference signals;
receiving the summed the second and third reference signals in a peak detector; and
adjusting the second phase and/or the second gain based on an output of the peak detector.

23. The method of claim 22, further comprising adjusting the second phase so that the output of the peak detector is maximized.

24. The method of claim 22, further comprising:
shifting the first phase by 180 degrees; and
adjusting the second gain so that the output of the peak detector is minimized.

25. The method of claim 22, further comprising amplifying the second and third reference signals.

26. A method comprising:
generating a calibration reference signal;
transmitting the calibration reference signal from a first antenna, the first antenna associated with a first gain and a first phase;
transmitting the calibration reference signal from a second antenna, the second antenna associated with a second gain and a second phase;
receiving a first reference signal at a third antenna corresponding to the calibration reference signal transmitted by the first antenna;
receiving a second reference signal at the third antenna corresponding to the calibration reference signal transmitted by the first antenna, the third antenna located equidistantly from the first and second antennas; and
adjusting the second gain and the second phase associated with the second antenna to match the first gain and the first phase associated with the first antenna by comparing the first reference signal received by the third antenna with the second reference signal received by the third antenna.

27. The method of claim 26, further comprising:
summing the first and second reference signals;
receiving the summed the first and second reference signals in a peak detector; and
adjusting the second phase and/or the second gain based on an output of the peak detector.

28. The method of claim 27, further comprising adjusting the second phase so that the output of the peak detector is maximized.

29. The method of claim 27, further comprising:
shifting the first phase by 180 degrees; and
adjusting the second gain so that the output of the peak detector is minimized.

30. The method of claim 27, further comprising amplifying the first and second reference signals.

* * * * *